United States Patent [19]
Beasom

[11] 3,865,649
[45] Feb. 11, 1975

[54] FABRICATION OF MOS DEVICES AND COMPLEMENTARY BIPOLAR TRANSISTOR DEVICES IN A MONOLITHIC SUBSTRATE

[75] Inventor: James D. Beasom, Indian Harbour Beach, Fla.

[73] Assignee: Harris-Intertype Corp., Cleveland, Ohio

[22] Filed: Oct. 16, 1972

[21] Appl. No.: 297,700

[52] U.S. Cl. .................... 148/187, 148/175, 357/42
[51] Int. Cl. ........................................... H01l 7/44
[58] Field of Search ............ 148/175, 187; 317/235

[56] References Cited

UNITED STATES PATENTS

| | | | |
|---|---|---|---|
| 3,575,646 | 4/1971 | Karcher | 317/235 |
| 3,576,475 | 4/1971 | Kronlage | 148/175 X |
| 3,611,067 | 10/1971 | Oberlin et al. | 148/175 X |
| 3,614,558 | 10/1971 | LeCan et al. | 148/175 X |
| 3,617,822 | 11/1971 | Kobayashi | 148/175 X |
| 3,716,425 | 2/1973 | Davidsohn | 148/187 X |

*Primary Examiner*—L. Dewayne Rutledge
*Assistant Examiner*—J. M. Davis
*Attorney, Agent, or Firm*—Fidelman, Wolffe & Leitner

[57] ABSTRACT

P and N channel MOS's, MOS capacitors, and PNP and NPN transistor devices are fabricated in isolated single crystal P and N type regions by a series of four deposition-diffusions common to both types of devices. The bases of PNP's and the sources and drains of N channel MOS's are formed simultaneously while the bases of NPN's, and the sources and drains of P channel MOS's, are also formed simultaneously. Thirdly, the emitters and collector contacts and guard rings of PNP's, the base contacts for NPN's, and the body contacts and guard rings for N channel MOS's are simultaneously formed. Finally, an N+ type diffusion is performed to form the emitters and collector contacts of NPN's, the source and drain contacts for N channel MOS's, the base contacts for PNP's, the body contacts for P channel MOS's and one plate of MOS capacitors. An additional step may be performed to obtain thin gate oxide MOS's and thin dielectric MOS capacitors. By surrounding the N channel MOS's drain with a combination of the P+ guard ring and the gate metal, this device will function in the depletion mode.

20 Claims, 9 Drawing Figures

FABRICATION OF MOS DEVICES AND COMPLEMENTARY BIPOLAR TRANSISTOR DEVICES IN A MONOLITHIC SUBSTRATE

FIELD OF THE INVENTION

The present invention relates to the fabrication of insulated gate field effect transistors and more particularly to the fabrication of MOS (metal-oxide-semiconductors) transistors.

DESCRIPTION OF THE PRIOR ART

The type of semiconductor device in which the conductivity of a portion of a semiconductive wafer may be modulated by an applied electric field is known as a field effect device. One kind of field effect device consists of those units which have an insulating layer over a portion of the surface of a crystalline semiconductive wafer, and have a control electrode disposed on this insulating layer. Units of this kind are known as insulated gate field-effect devices, and generally comprise a layer or wafer of crystalline semiconductive material, two spaced conductive regions adjacent one face of said layer, a film of insulating material on said one face between said two spaced regions, two metallic electrodes bonded respectively to said two spaced conductive regions which are known as the source and drain electrodes, and a metallic control electrode on said insulating film between said two spaced regions which is known as the gate electrode. One class of insulated gate device, known as the MOS (metal-oxide-semiconductor) field effect transistor, uses oxide as the insulating film on said face between the source and drain regions and under the gate electrode. This film usually consists of silicon oxide.

The prior art is well developed concerning the simultaneous fabrication of junction-type field effect transistors and other devices such as complementary bipolar transistors, capacitors and resistors. The insulated gate field-effect transistors, though having electrical characteristics very similar to those of the Junction-type field-effect transistors, differ in a fundamental way in operation from the junction-type field-effect transistors. In the junction-type devices, the channel is bound by metallurgical P-N junctions between itself and the lower gate whereas in the insulated gate field-effect transistors, the channel and the lower gate are homogeneous metallurgically or identical in impurity doping. The induced channel of the insulated gate transistors is distinguished from the lower gate in that it has a majority-carrier type opposite that of the lower gate.

The induced channel between the source and drain is produced by an inversion of conductivity type resulting from the interaction of the silicon-surface, the silicon-oxide layer, and the metal deposit on top of the silicon-oxide layer.

Since the induced channel region in the insulated gate transistor works on the inversion principle versus a junction channel and thus has different manufacturing limitations, the manufacturing techniques of junction field-effect transistors are not necessarily applicable to MOS transistors.

SUMMARY OF THE INVENTION

The present invention optimizes the number of steps needed to perform the simultaneous fabrication of MOS and bipolar transistors while producing acceptable induced channels. Optimization is obtained in that the process steps required to form the N channel MOS's are also required to form the PNP devices and similarly all the steps required to form the P channel MOS's are also required for the NPN devices. By using the four step deposition-diffusion process of the present invention wherein the last step uses an N type dopant, no special process step is required to form the oxide over the gate region and acceptable induced channels are produced. Unlike the prior art, the presently fabricated MOS devices operate in the depletion mode without any special metallic guard ring. The present invention uses a P+ guard ring in the body of the N channel MOS which, together with the gate metal, forms a closed path entirely surrounding the drain and therefore controls modulation and isolation. The present invention also accomplishes the simultaneous fabrication of MOS capacitive devices. An additional step may be performed to obtain thin gate oxide MOS's and thin dielectric MOS capacitors.

OBJECTS OF THE INVENTION

An object of the present invention is the simultaneous fabrication of MOS devices and complementary bipolar transistors.

A further object is to provide the manufacturing of MOS devices without any special steps for the modifying of the gate oxide region to produce acceptable induced channels.

A further object of the invention is the provision of a guard ring in the body region of the same conductivity type of the body and with the geometry such that the drain is entirely surrounded by a combination of this guard ring and the gate metal.

Still another object of the invention is the simultaneous fabrication of MOS transistors, MOS capacitors, complementary bipolar transistors and other devices.

A still further object of this invention is the formation of thin oxide gate MOS devices.

Other objects, advantages and novel features of the present invention will become apparent from the following detailed description of the invention when considered in conjunction with the accompanying drawings.

DESCRIPTION OF THE PREFERRED EMBODIMENTS

Figures 1, 2, 3:
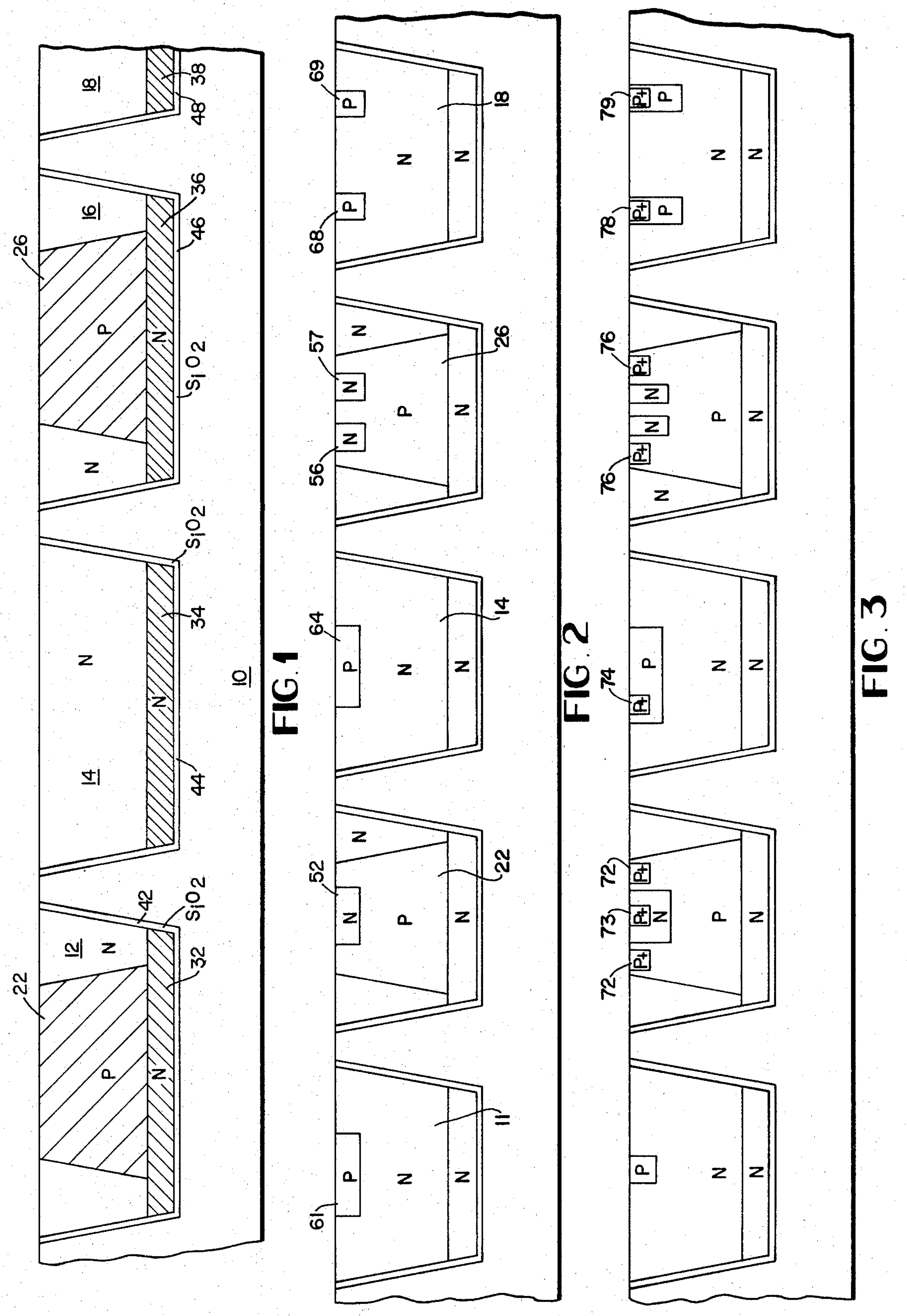
FIG. 1 is a cross-section of one type of isolated N and P type surface regions.
FIGS. 2–4 are cross-sectional views of the integrated circuit structure at successive stages of development in the fabrication of MOS transistors and complementary bipolar transistors as well as other devices.
Figure 9:
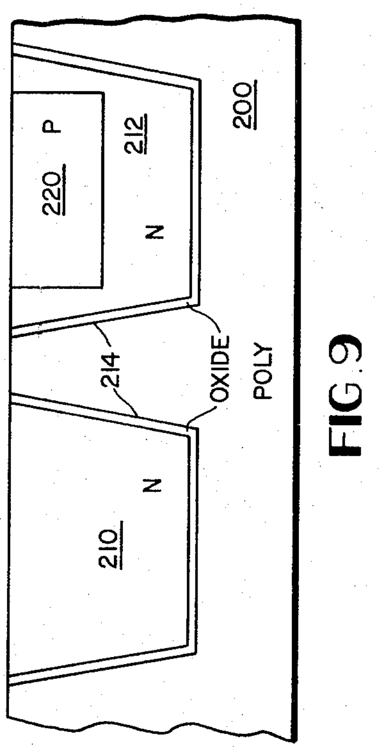
FIGS. 8 and 9 are cross-sectional views of other types of isolated N and P type surface regions.
Figure 8:
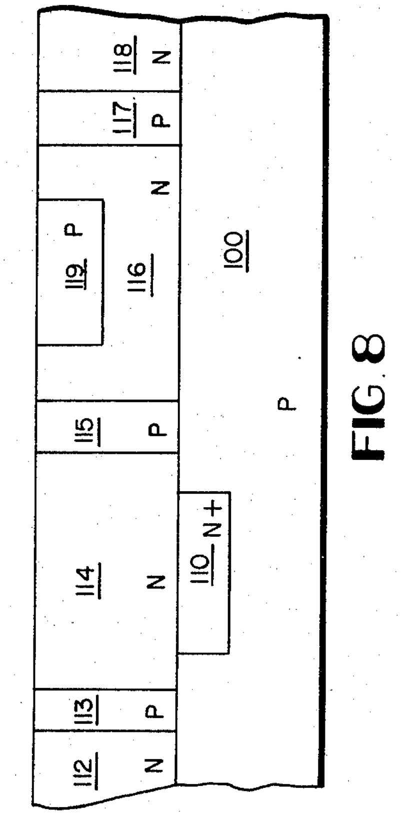

Referring to FIG. 1, a polycrystalline substrate 10 contains isolated single crystal P and N type surface layers in which NPN and PNP transistors and P and N channel MOS, as well as other devices, are to be built. FIG. 1 illustrates but one embodiment of isolated P and N type surface layers, whereas other applicable embodiments are shown in FIGS. 8 and 9 and will be described later.

The method of fabricating the isolated islands of FIG. 1 starts with an N type single crystal silicon slice doped preferably with antimony (Sb) to a resistivity of approximately 6 ohm-cm. This original N type starting slice becomes the N type surface regions 12,14,16 and 18 of FIG. 1. The slice is cleaned in successive baths of sulfuric acid at 160°C. and nitric acid at 90°C., rinsed in high purity $H_2O$ and dried. It is then placed in a conventional open tube diffusion furnace at a temperature of about 1,100°C. and exposed to a steam ambient for about 60 minutes to form a 6,000 angstrom layer of silicon dioxide on its surfaces.

Next the slice is processed through a conventional photoresist operation during which an array of patterns is formed in a layer of photosensitive material coated on one side of the wafer and then formed in the oxide by exposing the coated slice to a hydrofluoric etch solution which removes all oxide from those areas of the wafer not coated by the resist. The resist is then removed in a series of baths in J–100 resist stripper. This leaves an array of oxide free regions on the surface of the wafer; it is these regions which are to become the P type surface regions of the finished slice.

The slice is cleaned as before and subjected to a conventional deposition of boron, for example, and diffusion process at a temperature of 1,250°C. to form P type diffused regions in the oxide free areas of the slice having a junction depth of approximately 30 microns and a sheet resistance of approximately 350 ohms per square. This results in P type surface regions 22 and 26 for example. A 10,000 angstrom layer of oxide is grown over the diffused layer during the diffusion. All oxide is removed from the slice by stripping in hydrofluoric acid.

The slice is then processed through a conventional open tube deposition-diffusion process to form an N type layer with a sheet resistance of approximately 30 ohms per square and a junction depth of approximately 4.5 microns, using arsenic (AS) for example. This results in the N-type buried layers 32,34,36 and 38. During the diffusion, an 8,000 angstrom layer of silicon dioxide acts as a mask and defines the isolation pattern.

The slice is cleaned in sulfuric acid and then exposed to an ambient containing a material such as hydrochloric acid which etches silicon but not silicon dioxide. This results in the isolation pattern being etched into the silicon. The masking oxide is then stripped off in hydrofluoric acid and slice is oxidized to form a 10,000 angstrom layer of silicon dioxide over the etched face of the slice. This results in the oxide isolation regions 42,44,46 and 48 for the N and P type surface regions.

The slice is next placed in an epitaxial reactor where polycrystalline silicon is deposited on the oxidized etched face of the slice. This polycrystalline silicon becomes the substrate 10. Finally the other side of the slice is lapped and polished until the polishing plane intersects the etched isolation pattern. The P type diffusion performed earlier was made deeper than the distance from the lapping plane to the etched surface of the slice, consequently those regions containing a P type diffusion are P type at the lapping surface. The result is a slice having P type and N type surface regions isolated by the single polycrystalline dielectric method as shown in FIG. 1.

Though the slice preparation was described using specific dopants, etchants, strippers, times and temperatures, any applicable substitute is acceptable which will result in the isolated regions of FIG. 1.

The formation of various devices in the isolated surface regions of FIGS. 1, 8 or 9 can use conventional photoresist techniques as previously described in detail to define repetitive circuit patterns on the slice, followed by conventional cleaning and open tube deposition and diffusion process to form the junctions of which the various devices are composed. Since the techniques or processes were previously described in detail and are not considered as the essence of the invention, only the resulting structure will be considered in detail. The essence of the present invention lies in formation of complimentary bipolar transistors and N channel MOS, as well as other devices, in isolated regions using four basic deposition-diffusion steps.

The slice for the preferred embodiment is oxidized in steam at a temperature of approximately 1,100°c. to form a 6,000 angstrom oxide layer on its surface. A photoresist process is performed to define base regions of PNP's and source and drain regions of N channel MOS's in the isolated P type surface regions 22 and 26 respectively of the slice. The slice is cleaned and processed through an N type open tube deposition-diffusion process, using phosphorous for example, to form a diffused layer having a sheet resistance of about 80 ohms per square and a junction depth of about 2 microns covered with a 5,000 angstrom oxide layer. The resulting PNP's base and N channel MOS's source and drain are shown in FIG. 2 as 52,56 and 57, respectively. An N type diffused resistor may also be fabricated during this step.

A second photoresist process is performed to define base regions of NPN's, source and drain regions of P channel MOS's and P type diffused resistors in the N type surface regions. The slice is cleaned and an open tube P type deposition-diffusion process, using boron for example, is then performed to form a diffused layer having a sheet resistance of about 130 ohms per square and a junction depth of about 1.5 microns covered by a 5,000 angstrom oxide. The resulting P type diffused resistor, NPN's base and P channel MOS's source and drain are shown in FIG. 2 as 61,64,68 and 69, respectively.

The order of the first two deposition-diffusion steps is a matter of choice and may be reversed. The importance of these steps is the simultaneous fabrication of the bases of the PNP's and the sources and drains of the N channel MOS's and the simultaneous fabrication of the bases of the NPN's and the sources and drains of the P channel MOS's.

A third photoresist process step is performed to define P+ type emitter regions and collector contact and guard ring regions for the PNP's, base contact regions for the NPN's, guard rings and body contacts for the N channel MOS's, and source and drain contact regions for the P channel MOS's.

The slice is cleaned and processed through a P+ deposition-diffusion process, using boron for example, to form a diffused layer having a sheet resistance of about 15 ohms per square and a junction depth of about 1.5 microns in the areas exposed by the third photoresist process. FIG. 3 shows the resulting PNP's collector contact and guard ring 72, PNP's emitter 73, NPN's base contact 74, N channel MOS's body contact and guard ring 76, and P channel MOS's source contact 78 and drain contact 79. The slice is then oxidized in a steam ambient at a temperature of about 900°C. to form a 7,000 angstrom layer of silicon dioxide over the diffused P+ layers. A P type MOS capacitor may also be formed during this step. It should be noted that the second and third deposition-diffusion step may be combined into a single P type deposition-diffusion process step.

Figure 4:
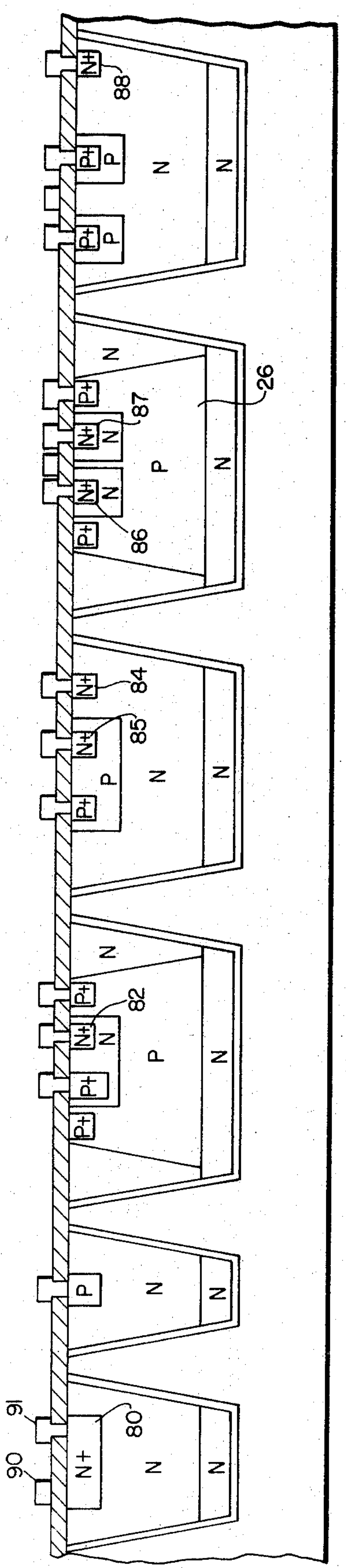

A fourth photoresist process step is performed to define N+ type emitter regions and collector contact regions for the NPN's, base contact regions for the PNP'S, source and drain contact regions for the N channel MOS's, body contacts for the P channel MOS's, and one plate of an N type MOS capacitor. The slice is cleaned and processed thorugh an N+ diffusion, using phosphorous for example, to form a diffused layer having a sheet resistance of about 3 ohms per square and a junction depth of about 1.2 microns in the regions exposed by the fourth photoresist process. FIG. 4 shows the resulting PNP's base contact 82, NPN's emitter 85 and collector contact 84, N channel MOS's source contact 86 and drain contact 87, P channel MOS's body contact 88, and MOS capacitor plate 80. It should be noted that the buried plate of the P type MOS capacitor could have been formed during the third diffusion step.

Except for a final oxide layer and metallization, the formation of complementary bipolar transistors and N channel MOS's as well as other devices, using four diffusion-deposition steps, is completed. The process produces the enumerated devices with high electronic characteristics and maximum isolation while minimizing the number of steps required for their simultaneous fabrication.

To complete the fabrication, the slice is oxidized in a steam ambient for about 30 minutes at a temperature of about 900°C. to form a 5,000 angstrom layer of oxide over these diffused regions. A fifth photoresist process step is performed to define contactapertures to the various regions. The slice is then cleaned and a metal, such as aluminum, is evaporated over the entire slice. A final photoresist process step is performed to define a pattern in the aluminum for connecting the components to form a desired circuit. The slice is cleaned in solvents and baked at a temperature of about 300°C. for approximately 20 hours to complete the process. The final configuration with metal contacts is shown in FIg. 4. Other conductive metal such as gold, palladium, chromium and the like may be used instead of aluminum. The conductive metal may be deposited by electroplating or by electrolysis plating instead of evaporation.

One significant aspect of the integrated circuit produced from the above processes is the formation of an MOS transistor as an active element without the use of any special gate dielectric formation step. The fabrication of MOS's in the prior art required an additional process step to form the gate dielectric. The gate dielectric of the MOS of the present invention is the oxide formed on a region of the surface of the slice between the source and drain which is never etched during any of the photoresist processes and whose final dopant was an N type which reduces degradation of performance caused by positive ion contamination.

This oxide will typically be about 10,000 angstroms thick and have a breakdown strength greater than 500 volts. This permits it to be used without diode protection in most applications which is desirable since the resistance, capacitance and leakage current of diode protection devices degrade the performance of the MOS device. The N channel MOS device has a useful threshold voltage of typically 0.25 volts despite this thick gate oxide because the doping of the P type surface layer in which it is built (its body) has a low impurity concentration of approximately $5 \times 10^{15}$ atoms/cm$^3$.

Another important property of this circuitry is that all the process steps required to form the N channel MOS are also required to form the PNP devices in the process, and similarly all the steps required to form the P channel MOS's are also required for the NPN devices. Consequently it is a very low cost element to include in integrated circuits where costs increase and yields decrease when additional process steps are employed to form additional types of components.

Figure 5:
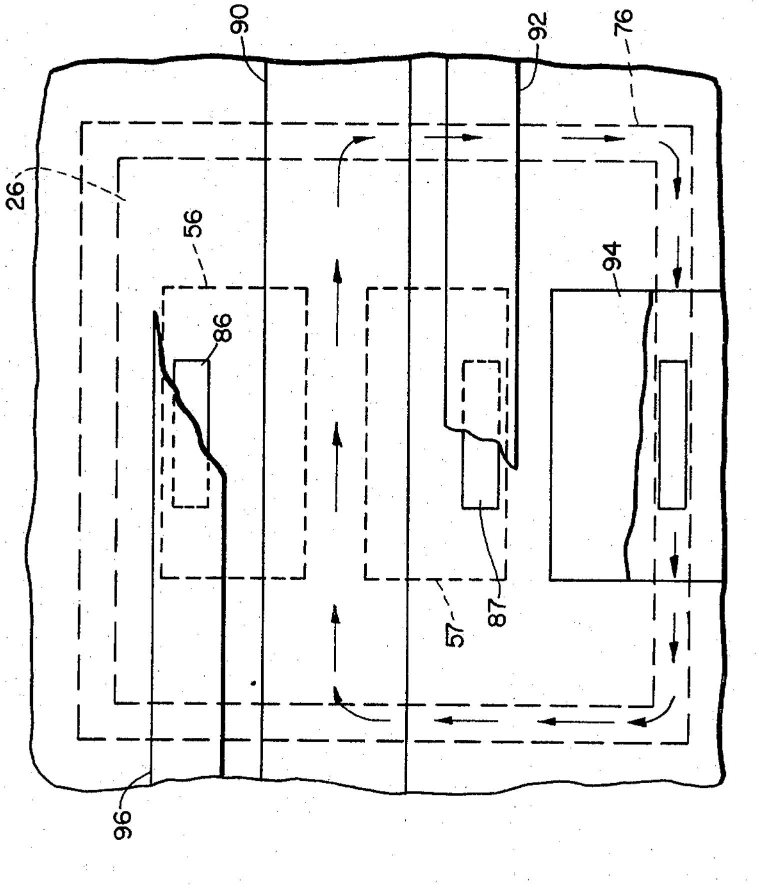
FIG. 5 is a top view of the final fabricated N channel MOS.

A further important aspect of the present process, which is depicted in FIG. 5, is the inclusion of the P+ guard ring 76 in the body 26 of the N channel MOS which together with the gate metal 90 form a closed path, indicated by the arrows, which entirely surrounds the drain 57. A characteristic of an N channel MOS is that the induced channel between the source and the drain is produced by an inversion of conductivity type resulting from the interaction of the silicon surface, the silicon oxide layer, and the metal deposited on top of the silicon oxide. The P+ guard ring 76 contains the N inversion layer within its periphery and thus prevents it from continuing throughout the integrated circuit.

The existance of this inversion layer shorts the drain and the source regions. Thus with no potential difference between the gate and source, the device is normal on. Making the gate negative with respect to the source causes the channel conductivity to decrease or operate in the depletion mode. Conversely, making the gate positive with respect to the source causes the channel conductivity to increase or operate in the enhancement mode.

It is the surrounding of the drain by the combination of the gate metal and the P+ guard ring which permits the N channel MOS of the present invention to function in the depletion mode. An alternative method used in the past to achieve this result is to surround the drain region with the gate metal. In an integrated circuit, this is not feasible because a metal contact must be made from the drain to other components and this drain contact metal would have to cross the gate metal if the gate metal surrounded the drain. This would result in a short circuit between the drain and body, or necessitate additional process steps to insulate the crossover points.

Figure 6:
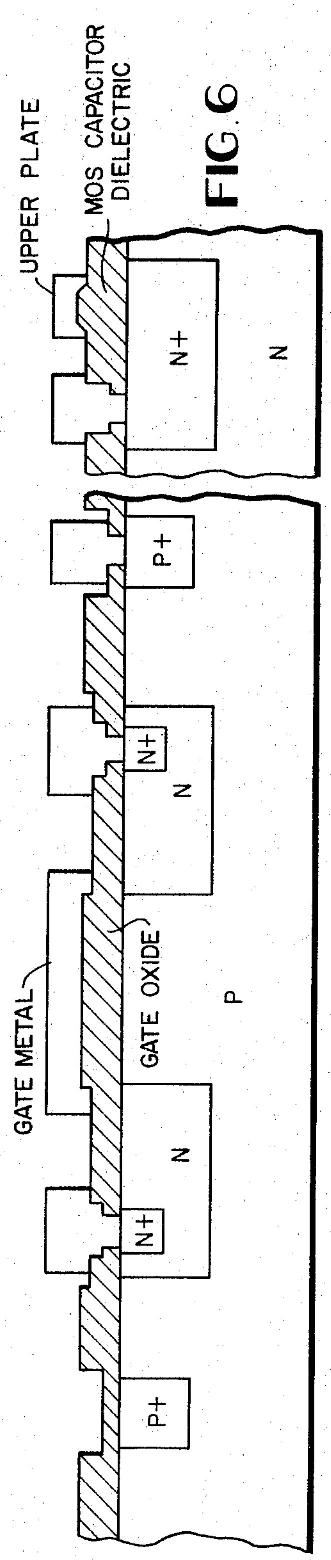
FIG. 6 is a cross-sectional view of the thick oxide gate MOS transistor and MOS capacitor.
Figure 7:
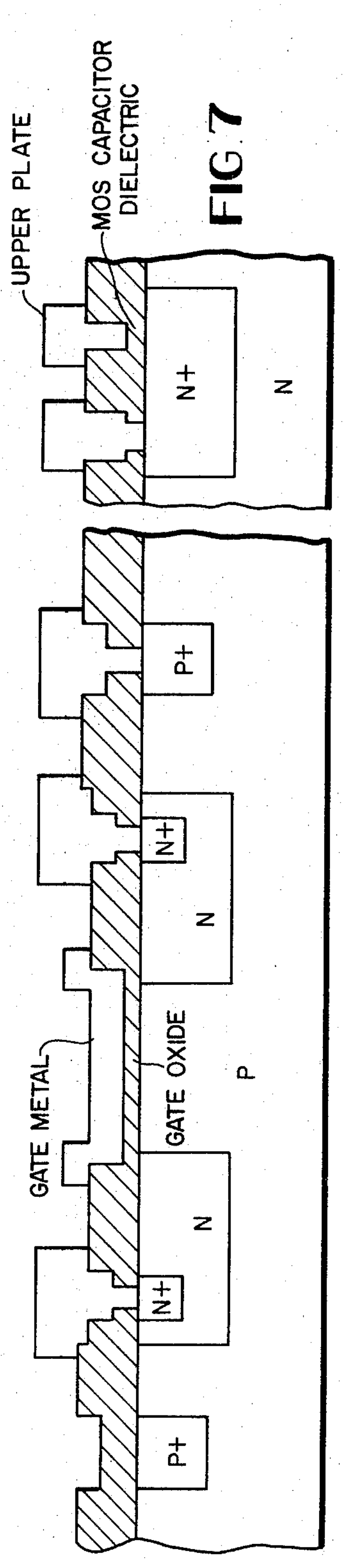
FIG. 7 is a cross-sectional view of the thin oxide gate MOS transistor and MOS capacitor.

An alternate method for the fabrication of the integrated circuits of the present invention can be used to obtain a thin gate oxide as illustrated in FIG. 7, instead of the thick or continuously grown thick gate oxide of the preferred embodiment as illustrated in FIG. 6. The alternate method differs from the method already described only after the completion of the fourth deposition-diffusion step. At this point, a photoresist process is performed to expose the channel regions of the P channel and N channel MOS's and MOS capacitors. An oxidation is then made to form an oxide layer of approximately 1,000 angstroms over these regions. This oxide is then doped with an N type dopant of phosphorus, for example. The aperture photoresist and subsequent steps are then performed as before. This results in thin oxide MOS transistor and capacitor devices in contrast to the thick oxide devices which are produced from the preferred process. The thin oxide devices require less chip area to achieve a given level of performance but require additional processing.

It is standard practice in the fabrication of integrated circuits using the diffusion technique to apply an oxide layer doped with phosphorus before the application of the metal leads. This oxide layer overcomes the effect of sodium positive ion contamination which results in degradation of threshold voltages. The phosphorus dopant enhances the oxide's solubility for sodium ions. Thus the N type doped oxide draws and traps the positive ions and thus counteracts their detrimental effects. In the thick oxide gate embodiment, the extra phosphorus is not needed since the fourth deposition-diffusion step is an N+ type of dopant which forms the desired phosphorus doped surface oxide layer. The thin oxide gate embodiment needs the extra step, since to form the thin oxide gate the N+ type doped oxide was removed.

As mentioned earlier, a substrate consisting of isolated P type and N type semiconductor surface layers, into which the monolithic MOS's and complementary bipolar devices are to be built, may be fabricated by various methods. A first alternative to the process already described is the junction isolated method whose final structure is illustrated in FIG. 8. Slective N+ type buried layers 110 of arsenic or antimony, for example, are diffused into a P type substrate in the conventional way. These buried layers are located below those regions in which NPN's, P channel MOS's and MOS capacitors are to be built. An N type epitaxial layer is then grown on the surface of the P type substrate which contains the buried layers. Next a photomasking operation is performed to delineate a conventional isolation pattern. A low resistivity P type diffusion, of boron, for example, resulting in a sheet resistance of about 10 ohms per square is made into this pattern and diffused partially through the epitaxial layer. This results in N type layer 112,114,116 and 118 separated by P type isolation barriers 113,115 and 117.

Another photomasking step is then performed to define collector regions for PNP's and body regions for N channel MOS's. A high resistivity P type diffusion, of boron for example, resulting in a sheet resistance of about 600 ohms per square is made into these regions (for example, 119) and diffused to a depth of about 10 microns. The isolation diffusion penetrates through the N epitaxial layer and into the substrate during this diffusion. This completes fabrication of a substrate with isolated N and P type regions as shown in FIG. 8.

The second alternative method of preparing a slice with isolated N type and P type regions, which is similar to the main method, utilizes dielectric isolation. As in the main method, an N type single crystal slice has an isolation pattern formed thereon by a conventional photoresist and oxide etch technique. Using an etchant such as hydrochloric acid, isolation valleys are formed in the N type silicon slice. The slice is then oxidized to form the isolation barrier and a polycrystalline silicon is deposited. Next the N type side of the slice is lapped and polished as in the main method.

The polished slice surface is oxidized to form a 6,000 angstrom layer of oxide on its front surface. A conventional photomasking and etch procedure is performed to remove oxide from the surface of those regions where it is desired to have a P type surface layer. A high resistivity P type diffusion, of boron for example, is then made into the regions to form deep diffused P layers having sheet resistance of about 600 ohms per square and a depth of about 10 microns. The resulting substrate 200 has N type surface regions 210 in which NPN's, P channel MOS's and MOS capacitors may be built and P type surface regions 220 in which PNP's and N channel MOS's may be built. These regions with oxide isolation barriers are shown in FIG. 9.

The process of the present invention minimizes the number of process steps required for the simultaneous fabrication of MOS devices and complementary bipolar transistors while producing acceptable induced channels.

What is claimed:

1. A process for the simultaneous fabrication of NPN, PNP, and MOS devices in isolated P and N type regions comprising in sequence:

diffusing to form in P type isolated regions bases of PNP's and sources and drains of N channel MOS's, diffusing to form in N type isolated regions bases of NPN's;

diffusing to form in P type isolated regions collector contacts of PNP's and body contacts of N channel MOS's, and to form emitters in said bases of PNP's; and diffusing to form collector contact of NPN's, source and drain contacts of N channel MOS's, base contacts of PNP's and emitters of NPN's.

2. A process as in claim 1 wherein the source and drain regions of P channel MOS's are formed in N type regions by said second diffusion steps;

source and drain contacts of P channel MOS's are formed by said third diffusion step; and body contacts of P channel MOS's are formed in N type isolated regions by said fourth diffusion step.

3. A process as in claim 1 wherein a P type diffused resistor is formed in an N type isolated region by said second diffusion step and an N type diffused resistor is formed in a P type isolated region by said first diffusion step.

4. A process as in claim 1 wherein a first plate of a P type MOS capacitor is formed in a P type isolated region by said third diffusion step and a first plate of an N type MOS capacitor is formed in a N type isolated region by said fourth diffusion step.

5. A process as in claim 4 wherein oxide is accumulated over said first plates of said MOS capacitors and the channel region of said N channel MOS transistors during the process.

6. a process as in claim 4 including:

partially etching oxide formed over said first plates of said MOS capacitors and the channel regions of said channel MOS transistors to form thin oxide dielectric MOS capacitors and thin gate oxide MOS transistors respectively.

7. A process as in claim 6 including doping said etched regions with an N type dopant.

8. A process as in claim 1 wherein oxide is accumulated over the channel region of said MOS transistors during said four diffusion steps.

9. A process as in claim 1 including partially etching oxide formed over the channel region of said MOS transistors to form thin gate oxide MOS transistors.

10. A process as in claim 9 including doping said etched regions with an N type dopant.

11. A process as in claim 1 wherein said second and third diffusion steps are performed by a single P type diffusion.

12. A process as in claim 11 including:

partially etching oxide formed over the channel region of said MOS transistors to form thin gate oxide MOS transistors; and doping said etched regions with an N type dopant.

13. A process as in claim 1 wherein guard rings are formed in said P type isolated region on three sides of said drain regions by said third diffusion step.

14. A process as in claim 13 including applying metal to form gates across the channels of said N channel MOS's such that said drain regions are surrounded by said guard rings and said metal gates.

15. A process for fabricating PNP's and N channel MOS's in isolated P type surface regions comprising:

diffusing to form bases of PNP's and sources and drains of N channel MOS's;

diffusing to form collector contacts and emitters of PNP's and body contact of N channel MOS's; and diffusing to form source and drain contacts of N channel MOS's and base contact of PNP's.

16. A process as in claim 15 wherein guard rings are formed in said P type isolated regions on three sides of said drain regions by said third diffusion step.

17. A process as in claim 16 including applying metal to form gates across the channels of said N channel MOS's such that said drain regions are surrounded by said guard rings and said metal gates.

18. A process as in claim 15 including:

partially etching oxide formed over the channel region of said MOS transistors to form thin gate oxide MOS transistors; and doping said etched regions with an N type dopant.

19. A process for the simultaneous fabrication of MOS capacitors and MOS transistors including the steps of forming a heavily doped N or P type semiconductor region for one plate of said MOS capacitor and forming the sources and drains, and body contacts for said N and P channel MOS transistors wherein the last steps before metallization comprises:

partially etching oxide formed over said semiconductor plate of said capacitors and the channel regions of said transistors to form thin dielectric MOS capacitors and thin gate oxide MOS transistors, respectively; and doping said etched regions with an N type dopant.

20. A process as in claim 1 wherein said first and second diffusions may be performed in reverse order.

* * * * *